US006624058B1

(12) United States Patent
Kazama

(10) Patent No.: US 6,624,058 B1
(45) Date of Patent: Sep. 23, 2003

(54) SEMICONDUCTOR DEVICE AND METHOD FOR PRODUCING THE SAME

(75) Inventor: Takao Kazama, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/716,463

(22) Filed: Nov. 21, 2000

(30) Foreign Application Priority Data

Jun. 22, 2000 (JP) ........................................ 2000-187398

(51) Int. Cl.[7] .............................................. H01L 21/44
(52) U.S. Cl. ........................................ 438/612; 436/118
(58) Field of Search ................................ 438/106–127, 438/612–617; 257/678–700, 701–713, 734–738, 790, 796

(56) References Cited

U.S. PATENT DOCUMENTS

| | | | | |
|---|---|---|---|---|
| 5,036,024 A | * | 7/1991 | Mine et al. ................... | 257/790 |
| 5,280,193 A | * | 1/1994 | Lin et al. ..................... | 257/685 |
| 5,281,193 A | * | 1/1994 | Colbo, Jr. .................... | 482/104 |
| 5,583,376 A | * | 12/1996 | Sickler et al. ............... | 257/698 |
| 5,592,025 A | * | 1/1997 | Clark et al. .................. | 257/690 |
| 5,793,118 A | * | 8/1998 | Nakajima ..................... | 257/706 |
| 5,909,633 A | * | 6/1999 | Haji et al. ................... | 438/106 |
| 5,985,695 A | * | 11/1999 | Freyman et al. ............. | 257/668 |
| 6,078,377 A | * | 6/2000 | Tomono et al. .............. | 349/106 |
| 6,157,085 A | * | 12/2000 | Terashima ................... | 257/691 |
| 6,207,476 B1 | * | 3/2001 | Zhao et al. ................... | 438/112 |
| 6,291,271 B1 | * | 9/2001 | Lee et al. ..................... | 438/121 |

FOREIGN PATENT DOCUMENTS

| | | | |
|---|---|---|---|
| JP | 1-146543 | 10/1989 | |
| JP | 04-165634 | 6/1992 | |
| JP | 07-122586 | 5/1995 | |
| JP | 10214849 A | * 8/1998 | ........... H01L/21/52 |
| JP | 10-242184 | 9/1998 | |
| JP | 11-067798 | 3/1999 | |
| JP | 11214591 A | * 8/1999 | ........... H01L/23/29 |
| JP | 2000-025074 | 1/2000 | |

* cited by examiner

Primary Examiner—Olik Chaudhuri
Assistant Examiner—Brook Kebede
(74) Attorney, Agent, or Firm—Rabin & Berdo, P.C.

(57) ABSTRACT

There is provided a semiconductor device in which substantially no deformation of a bonded wire occurs, and a method for producing the semiconductor device. A wiring pattern of a wiring substrate and an electrode of an IC chip are connected by a wire. A contact prevention resin whose height is higher than the highest position of the bonded wire, is adhered to the approximate center of the surface of the IC chip. If the wiring substrate warps due to heat from the lower metallic mold, an inner surface of an upper metallic mold placed on the wiring substrate abuts against the contact prevention resin, and decrease warpage of the wiring substrate. Accordingly, the wire is kept from contacting the inner surface of the upper metallic mold. Thereafter, the IC chips, the wires, and the like are sealed by injecting a mold resin into the molds.

6 Claims, 5 Drawing Sheets

SEMICONDUCTOR DEVICE AND METHOD FOR PRODUCING THE SAME

BACKGROUND OF THE INVENTION

1. Field of the Invention

The present invention relates to a resin seal type semiconductor device, and a method for producing the same.

2. Description of the Related Art

Recently, in keeping with the tendency toward high density packaging of electrical appliances, there has been increased demand for thin and small-sized semiconductor devices, and the production quantity of resin seal type packages such as Ball Grid Array/Chip Size Package (BGA/CSP) has increased. In these circumstances, in order to improve BGA/CSP production or the like, a production method using package molding/saw cutting techniques has been widely used where a plurality of integrated circuit (IC) chips are fixed to one wiring substrate and sealed all together by mold resin. Thereafter, the wiring substrate is cut into separate semiconductor devices.

FIG. 2 is a cross sectional view showing an example of a conventional semiconductor device.

The semiconductor device shown in this drawing is that of BGA/CSP type produced by using package molding/saw cutting technique. An IC chip 3 is fixed onto a wiring substrate 1 by an adhesive agent 2. The wiring substrate 1 is, for example, formed of a glass/epoxy substrate having a thickness of 0.2 mm or thereabouts. Wiring patterns 1a and 1b are respectively formed on face and reverse surfaces of the wiring substrate 1 in the periphery thereof and are electrically connected to each other via a through hole 1c.

The wiring pattern 1a formed on the face surface of the wiring substrate 1 and an electrode 3a on the surface of the IC chip 3 are connected by a wire 4 such as gold wire. The surface of the wiring substrate 1 is sealed by a mold resin 5 having a predetermined thickness so as to protect the IC chip 3 and the wire 4. A soldering ball 6 having a diameter of 0.5 mm or thereabouts is attached to the wiring pattern 1b formed on the reverse surface of the wiring substrate 1 so as to make connection with a printed circuit board or the like.

Such semiconductor devices as above are produced by the following process.

First, a wiring substrate is produced in which plural sets of wiring patterns 1a and 1b, and through holes 1c are arranged, corresponding to each of the plural IC chips 3, in transverse and vertical directions in a region around a corresponding IC chip 3. Subsequently, the plural IC chips 3 are each fixed by the adhesive agent 2 to a predetermined position on the wiring substrate, and an electrode 3a on the surface of the IC chip 3 and the wiring pattern 1a corresponding thereto are connected by the wire 4 for wire bonding.

Further, the wiring substrate on which the plural IC chips 3 are mounted is placed on a lower metallic mold heated to 170° C. or thereabouts, and a corresponding upper metallic mold is placed thereon. The mold resin 5 is injected from an injection hole formed in the upper metallic mold into an interior of the molds and a cavity formed by an inner surface of the upper metallic mold, and the wiring substrate is sealed by the mold resin 5.

After the mold resin 5 has been cured, the wiring substrate of which surface is sealed by the mold resin 5, is taken out by releasing the upper and lower metallic molds therefrom. The resin-sealed wiring substrate is cut into separate semiconductor devices corresponding to the IC chips 3 by using a cutting saw. The soldering ball 6 is attached to the wiring pattern 1b on the reverse side of each of the separate wiring substrates 1, to thereby form a complete semiconductor device. Thus, productivity markedly improves as compared with a method in which wiring semiconductor devices are separately molded one by one.

However, the above-described structure of semiconductor devices and method for producing the same, which have been conventionally known, have the following problems.

When the wiring substrate having dimensions of, for example 60 mm×180 mm, is placed on a lower metallic mold heated to 170° C. or thereabouts, the wiring substrate is warped due to heat from the lower metallic mold and a portion of the wiring substrate may be raised from the lower metallic mold. When the upper metallic mold is placed on the wiring substrate in the above-described state, there exists a problem in which the bonded wire 4 contacts the inner surface of the upper metallic mold and thereby deforms. In this regard, there is a risk of causing short-circuits due to deformed wires 4 contacting each other.

SUMMARY OF THE INVENTION

The present invention has been devised to solve the above-described problems existing in the conventional method, and an object of the present invention is to provide a semiconductor having a structure in which reduced deformation of a bonded wire occurs, and a method for producing the semiconductor device.

In order to solve the above-described problem, in accordance with a first aspect of the present invention, there is provided a method for producing a semiconductor device, comprising the steps of: (a) bonding a plurality of semiconductor elements onto a wiring substrate, the wiring substrate having a wiring pattern formed thereon for external connection, and each semiconductor having a surface with an electrode thereon; (b) connecting the electrode on the surface of each of the semiconductor elements to the wiring pattern on the wiring substrate with a metal wire; (c) fixing a contact prevention resin having a predetermined height to the surface of at least one of the plurality of semiconductor elements; (d) placing the wiring substrate, with the surface of each of the semiconductor elements facing upward, in a lower metallic mold for mold processing; (e) putting an upper metallic mold for mold processing on the wiring substrate placed in the lower metallic mold; (f) injecting mold resin into a space formed between the wiring substrate and the upper metallic mold for sealing the semiconductor element and the metal wire on the wiring substrate; and (g) cutting the wiring substrate sealed by the mold resin into portions corresponding to the plurality of semiconductor elements to thereby form a plurality of semiconductor devices.

In the first aspect of the present invention, since the above-described method for producing a semiconductor device is provided, the following operation is performed.

A plurality of semiconductor elements are bonded onto a wiring substrate on which wiring patterns are formed corresponding to the plurality of semiconductor elements. Further, an electrode on the surface of each of the semiconductor elements and a wiring pattern corresponding thereto are connected by a metal wire and contact prevention resin having a predetermined height is fixed to the surface of each of the semiconductor elements. The wiring substrate on which the plurality of semiconductor elements are mounted, is placed on the lower metallic mold for mold processing, and an upper metallic mold is placed on the wiring substrate. The mold resin is injected into the space formed between the upper metallic mold and the wiring substrate, thereby sealing the wiring substrate. The wiring substrate sealed by the mold resin is cut into portions corresponding to the semiconductor elements, thereby forming a plurality of semiconductor devices.

In accordance with a second aspect of the present invention, there is provided a method for producing a semiconductor device, comprising the steps of: (a) bonding a plurality of semiconductor elements onto a wiring substrate, the wiring substrate having a wiring pattern for external connection formed thereon, and each semiconductor having a surface with an electrode thereon; (b) connecting the electrode on the surface of each semiconductor element to the wiring pattern on the wiring substrate with a metal wire; (c) placing, in a lower metallic mold for mold processing, the wiring substrate with the surfaces of the semiconductor elements facing upward; (d) placing an upper metallic mold for mold processing on the wiring substrate placed in the lower metallic mold, the upper mold having a contact prevention protruding portion on an internal surface of the upper metallic mold; (e) injecting mold resin into a space formed between the wiring substrate and the upper metallic mold sealing the semiconductor element and the metal wire on the wiring substrate; and (f) cutting the wiring substrate sealed by the mold resin into portions corresponding to the plurality of semiconductor elements to thereby form a plurality of semiconductor devices.

In the second aspect of the present invention, preferably, the protruding portion on the internal surface of the upper metallic mold is formed at a position corresponding substantially to the center of at least one of the plurality of semiconductor elements bonded to the wiring substrate, and a dimension of the protruding portion in a direction in which it protrudes is greater than a distance between the surface of the semiconductor element and a highest maximum position of the metal wire, and smaller than a height of the mold resin injected onto the semiconductor element, relative to surfaces of the semiconductor element.

Further, in the second aspect of the present invention, preferably, the protruding portion on the internal surface of the upper metallic mold is formed at a boundary between the semiconductor elements, and a dimension of the protruding portion in a direction to which it protrudes is equal to a height of a space formed between the wiring substrate and the upper metallic mold.

In the above-described first and second aspects of the present invention, the following operation is performed.

A plurality of semiconductor elements are bonded onto a wiring substrate on which wiring patterns are formed corresponding to the plurality of semiconductor elements. An electrode on the surface of each of the semiconductor elements and a wiring pattern corresponding thereto are connected by a metal wire. The wiring substrate on which the plurality of semiconductor elements are mounted, is placed on a lower metallic mold for mold processing. An upper metallic mold having a contact prevention protruding portion formed inside thereof, is placed on the wiring substrate. Mold resin is injected into a space formed between the upper metallic mold and the wiring substrate, thereby sealing the wiring substrate. The wiring substrate sealed by the mold resin is cut into portions corresponding to the semiconductor elements, thereby forming a plurality of semiconductor devices.

In accordance with a third aspect of the present invention, there is provided a semiconductor device comprising: (a) a semiconductor element having a plurality of electrodes on the surface thereof; (b) a wiring substrate having a wiring pattern for external connection, to which wiring substrate the semiconductor element is fixed by an adhesive agent applied to a reverse surface thereof; (c) a metal wire connecting the plurality of electrodes on the semiconductor element to the wiring pattern of the wiring substrate; (d) contact prevention resin having a predetermined height, fixed substantially at the center of the surface of the semiconductor element; and (e) mold resin sealing and protecting the surface of the wiring substrate, the semiconductor element, the metal wire, and the contact prevention resin.

According to the first aspect of the present invention, the contact prevention resin having a predetermined height is adhered to the surface of each of the semiconductor elements. As a result, even if the wiring substrate warps due to heating or the like, when the upper metallic mold for mold processing is placed on the wiring substrate, the inner surface of the upper metallic mold abuts against the contact prevention resin, and thus the metal wire is protected. Therefore, there is reduced risk of deforming the metal wire.

According to the second aspect of the present invention, the contact prevention protruding portion is formed at the inner side of the upper metallic mold for mold processing. As a result, even if the wiring substrate warps, the metal wire is protected by the protruding portion of the upper metallic mold when the upper metallic mold is placed on the wiring substrate. Accordingly, there is reduced risk of deforming the metal wire.

Further, in the second aspect of the present invention, the protruding portion provided inside of the upper metallic mold is preferably formed at a position corresponding substantially to the center of the semiconductor element bonded onto the wiring substrate in such a manner that the dimension of the protruding portion in a direction to which it protrudes is greater than a distance between the surface of the semiconductor element and the highest position of the metal wire connected to the semiconductor element, and is also smaller than the height of the mold resin injected onto the semiconductor element from the semiconductor element surface. As a result, even if the wiring substrate warps, the protruding portion of the upper metallic mold abuts against the surface of the semiconductor element when the upper metallic mold is placed on the wiring substrate, and the metal wire is thereby protected.

Moreover, in the second aspect of the present invention, the protruding portion provided inside of the upper metallic mold is preferably formed at a position corresponding to a boundary between the plurality of semiconductor devices in such a manner that the height of the protruding portion is substantially equal to that of the mold resin formed on the semiconductor element. As a result, even if the wiring substrate warps, the protruding portion of the upper metallic mold abuts against the wiring substrate at a position corresponding to the boundary between the semiconductor devices with the upper metallic mold placed on the wiring substrate. Accordingly, warp of the wiring substrate is suppressed and the metal wire is thereby protected.

According to the third aspect of the present invention, the contact prevention resin having a predetermined height is fixed to the surface of each of the semiconductor elements. As a result, when mold processing is carried out in which the semiconductor elements are mounted all together on the wiring substrate, even if the wiring substrate warps, the inner surface of the upper metal mold placed on the wiring substrate abuts against the contact prevention resin and the metal wire is thereby protected. Accordingly, there is reduced risk of deforming the metal wire.

DESCRIPTION OF THE PREFERRED EMBODIMENTS

First Embodiment

Figure 1A:
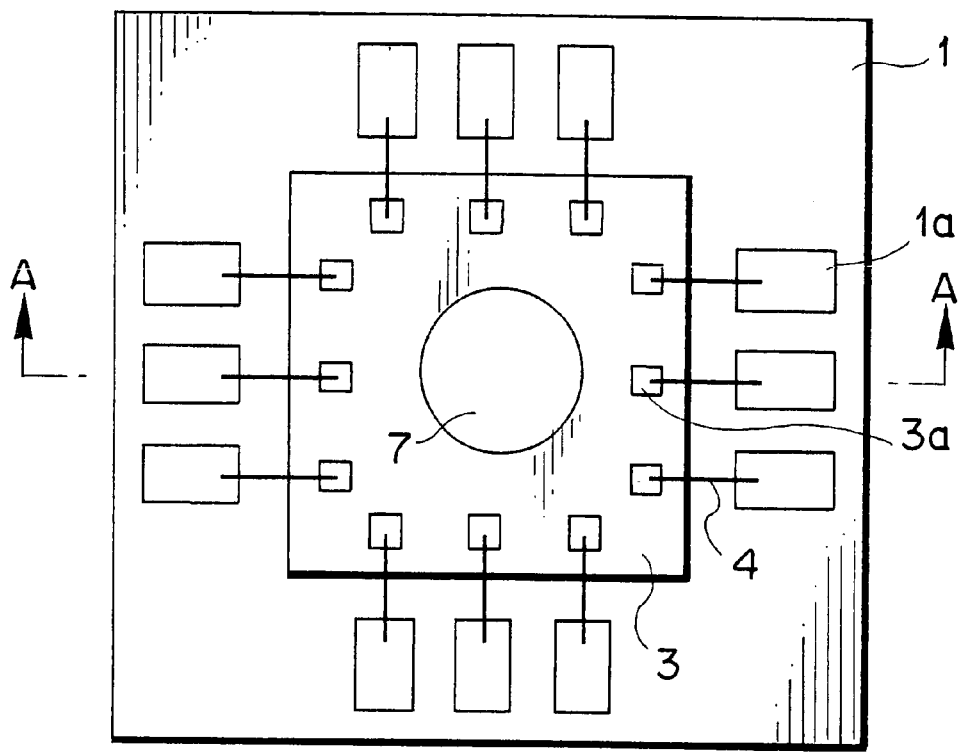
FIGS. 1A and 1B are each a structural diagram of a semiconductor device according to a first preferred embodiment of the present invention.
Figure 1B:
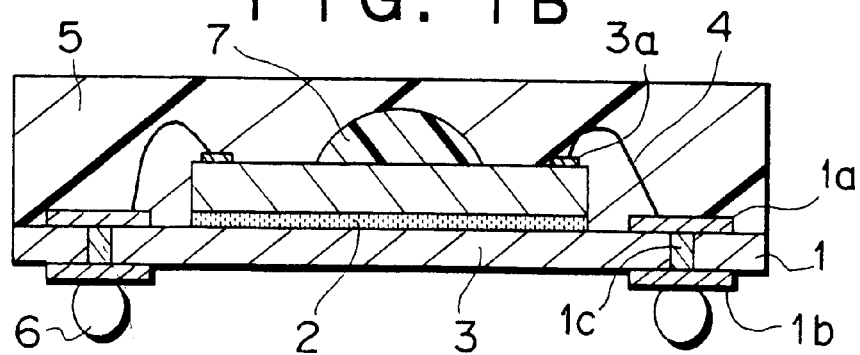
Figure 2:
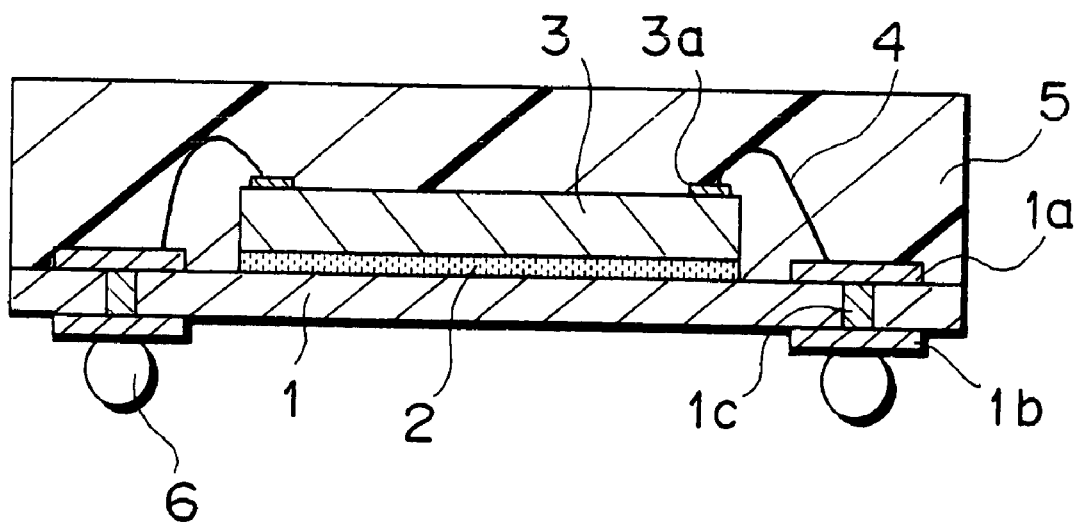
FIG. 2 is a cross sectional view showing an example of a conventional semiconductor device.

FIGS. 1A and 1B are each a structural diagram of a semiconductor device according to a first preferred embodiment of the present invention. FIG. 1A is a plan view and FIG. 1B is a cross sectional view taken along the line A—A in FIG. 1A. In FIGS. 1A and 1B, the same members as those in FIG. 2 are denoted by the same reference numerals.

The semiconductor device shown in FIGS. 1A and 1B is that of BGA/CSP type produced by package molding/saw cutting techniques. A semiconductor element 3 (for example, an IC chip) is fixed onto a wiring substrate 1 by an adhesive agent 2. The wiring substrate 1 is formed of, for example a glass/epoxy substrate having a thickness of 0.2 mm or thereabouts and transverse and vertical dimensions of approximately 5 to 15 mm. Wiring patterns 1a and 1b are respectively formed on face and reverse surfaces of the wiring substrate 1 in the periphery thereof. Further, the wiring patterns 1a and 1b are electrically connected to each other via a through hole 1c.

The wiring pattern 1a on the face surface of the wiring substrate 1 and an electrode 3a on the surface of the IC chip 3 are connected to each other by metal wire 4 (for example, gold wire) which is bonded to the wiring pattern 1a and to the electrode 3a. Further, a contact prevention resin 7 adheres to a central portion on the surface of the IC chip 3. The height of the contact prevention resin 7 is set so as to be higher than the highest position of the bonded wire 4.

The surface of the wiring substrate 1 is sealed by a mold resin 5 having a predetermined thickness so as to protect the IC chip 3, the wire 4, and the like. Furthermore, a soldering ball 6 having a diameter of approximately 0.5 mm is attached to the wiring pattern 1b on the reverse surface of the wiring substrate 1 for connection to a printed circuit board or the like.

Figure 3A:
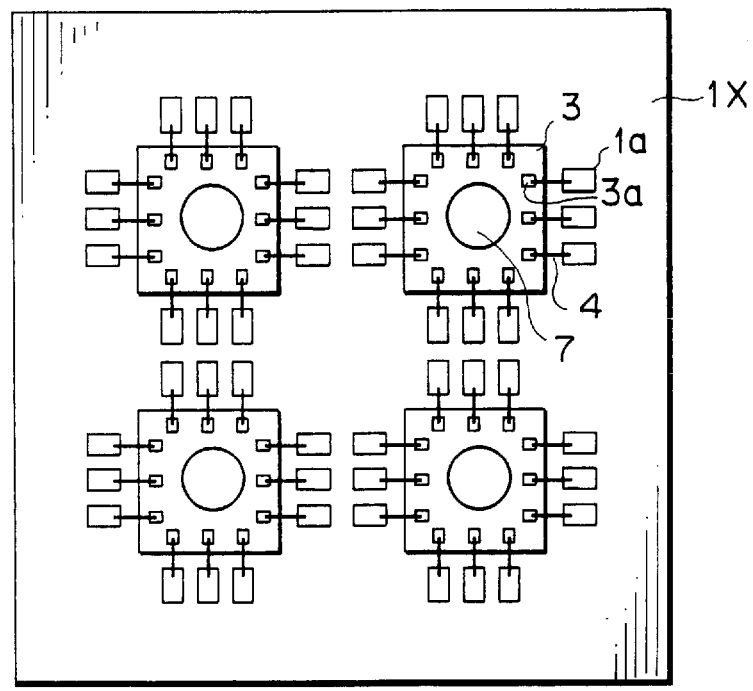
FIGS. 3A, 3B, and 3C are explanatory diagrams showing a method for producing the semiconductor device shown in FIGS. 1A and 1B.
Figure 3B:
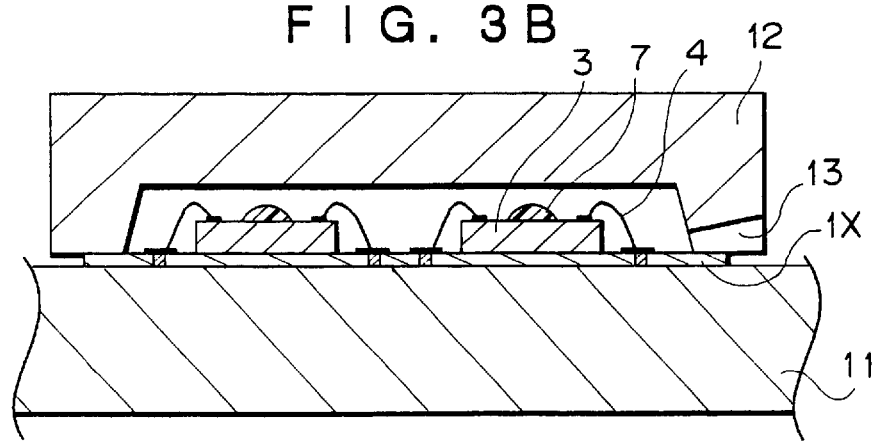
Figure 3C:
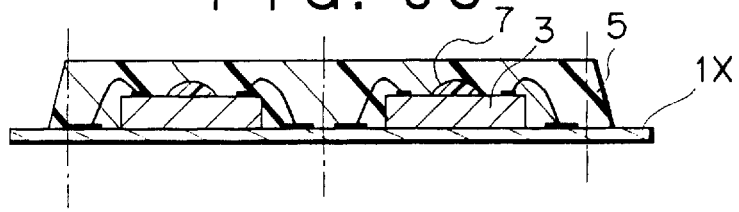

FIGS. 3A to 3C are explanatory diagrams showing a method for producing the semiconductor device shown in FIGS. 1A and 1B. With reference to FIGS. 3A to 3C, the method for producing the semiconductor device shown in FIGS. 1A and 1B will be described hereinafter.

As illustrated in FIG. 3A, first, a wiring substrate 1X is produced in which plural sets of wiring patterns 1a and 1b, and through holes 1c are arranged, corresponding to each of the plural (in this case, four) IC chips 3, in transverse and vertical directions in a region around a corresponding IC chip 3. The wiring substrate 1X has dimensions of approximately 60 mm (width)×180 mm (length)×0.2 mm (thickness). The plural IC chips 3 are each fixed by an adhesive agent 2 (see FIG. 1B) at a predetermined position on the wiring substrate 1X. The electrode 3a on the surface of each IC chip 3 and the wiring pattern 1a corresponding thereto are connected to each other by wire 4, which is bonded to the electrode 3a and the wiring pattern 1a. Further, the contact prevention resin 7 is adhered to a central portion on the surface of each IC chip 3.

Next, as illustrated in FIG. 3B, the wiring substrate 1X on which the IC chips 3 are mounted is placed on a lower metallic mold 11 heated to approximately 170° C., and a corresponding upper metallic mold 12 is placed thereon. At this time, if an amount of warp caused in the wiring substrate 1X is greater than a clearance between the contact prevention resin 7 and the upper metallic mold 12, the contact prevention resin 7, rather than the wire 4, first contacts the upper metallic mold 12. As a result, the inner surface of the upper metallic mold 12 and the wire 4 are kept from contacting each other, and the final amount of warp caused in the wiring substrate 1X decreases.

After the wiring substrate 1X has been interposed between the upper and lower metallic molds 12 and 11, the mold resin 5 is injected into the molds from an injection hole 13 provided in the upper metallic mold 12 at a predetermined pressure. As a result, the mold resin 5 is injected into a cavity formed between the inner surface of the upper metallic mold 12 and the wiring substrate 1X and the wiring substrate 1X is pushed against the lower metallic mold 11 due to pressure applied to the mold resin 5. Therefore, the warp of the wiring substrate 1X is corrected.

Further, as illustrated in FIG. 3C, after the mold resin 5 has been cured, the upper and lower metallic molds 12 and 11 are removed and the wiring substrate 1X of which its surface is sealed by the mold resin 5, is removed. The wiring substrate 1X thus molded is cut into semiconductor devices corresponding to the IC chips 3 by using a cutting saw. A soldering ball 6 is attached to the wiring pattern 1b on the reverse surface of each of separate wiring substrates 1, and the semiconductor device shown in FIGS. 1A and 1B is thus completed.

As described above, the semiconductor device according to the first embodiment is produced in such a manner that after the contact prevention resin 7 whose height is higher than the highest position of the bonded wire 4, is adhered to the surface of each of the IC chips 3 mounted on the wiring substrate 1X. The wiring substrate 1X is sealed by the mold resin 5 while interposed between the upper and lower metallic molds 12 and 11. As a result, there is insignificant risk that when the wiring substrate 1X is interposed between the upper and lower metallic modes 12 and 11, that the wire 4 contacts the inner surface of the upper metallic mold 12, thereby preventing deformation of the wire 4 and short circuits caused by deformed wires 4 contacting each other.

Second Embodiment

Figure 4A:
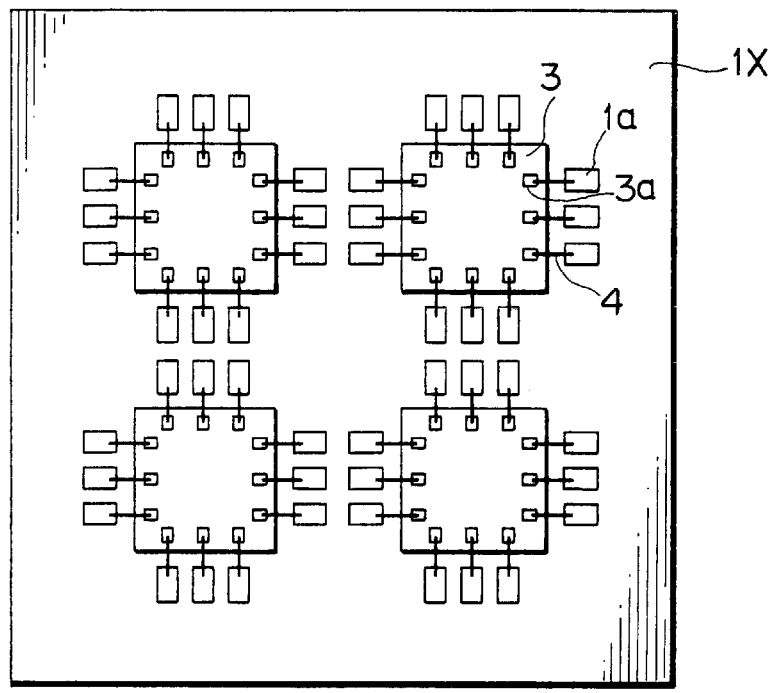
FIGS. 4A, 4B, and 4C are explanatory diagrams showing a method for producing a semiconductor device according to a second preferred embodiment of the present invention.
Figure 4B:
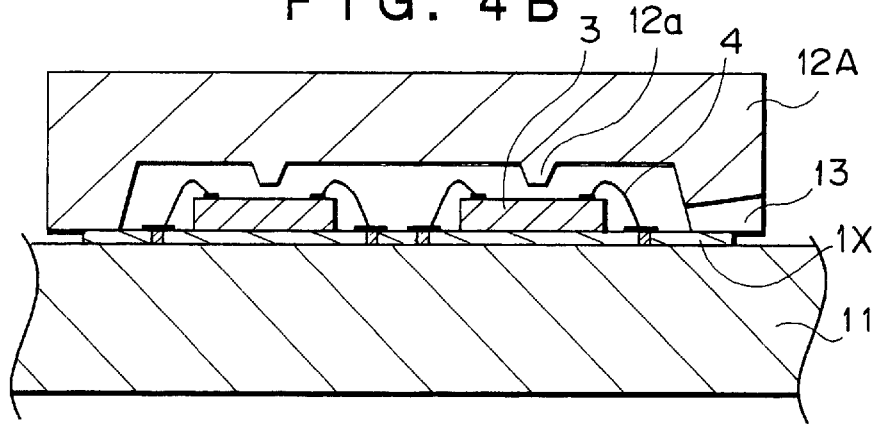
Figure 4C:
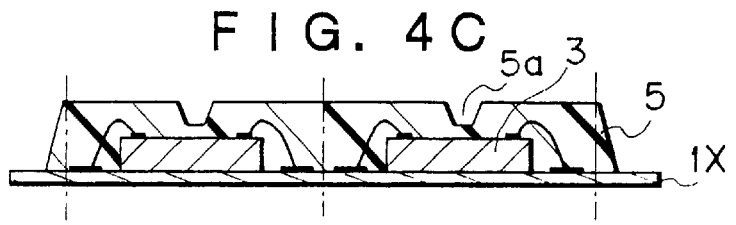

FIGS. 4A to 4C are explanatory diagrams showing a method for producing a semiconductor device according to a second preferred embodiment of the present invention. It should be noted that the same members as those in FIGS. 3A to 3C will be denoted by the same reference numerals.

In the above-described production method shown in FIGS. 3A to 3C, the contact prevention resin 7 adheres to the surface of the IC chip 3 so as to prevent the wire 4 from contacting the inner surface of the upper metallic mold 12. In comparison, in the production method shown in FIGS. 4A to 4C, an upper metallic mold 12A is used which has contact prevention protruding portions 12a formed at the inner side of the upper metallic mold at positions corresponding to respective central portions on the surfaces of the IC chips 3.

Referring now to FIGS. 4A to 4C, the method for producing a semiconductor device according to the second embodiment will be described hereinafter.

As illustrated in FIG. 4A, first, the wiring substrate 1X is produced in which plural sets of wiring patterns 1a and 1b, and through holes 1c are arranged, corresponding to each of the plural IC chips 3, in transverse and vertical directions in a region around a corresponding IC chip 3. The IC chips 3 are fixed by adhesive agents 2 at their respective predetermined positions on the wiring substrate 1X. The electrode 3a on the surface of each IC chip 3 and the wiring pattern 1a corresponding thereto are connected to each other by wire 4 bonded to the electrode 3a and to the wiring pattern 1a.

Subsequently, as illustrated in FIG. 4B, the wiring substrate 1X on which the IC chips 3 are mounted, is placed on the lower metallic mold 11 heated to 170° C. or thereabouts, and the corresponding upper metallic mold 12A is placed thereon. As described above, the upper metallic mold 12A has the contact prevention protruding portions 12a formed at the inner side thereof at positions corresponding to respective central portions on the surfaces of the IC chips 3. The heightwise dimension of the protruding portion 12a is set so as to be greater than a distance from the surface of the IC chip 3 to the highest position of the bonded wire 4 and also smaller than the heightwise dimension of the mold resin 5 formed on the IC chip 3.

When an amount of warp caused in the wiring substrate 1X is greater than the heightwise dimension of the protruding portion 12a formed in the upper metallic mold 12A, the upper metallic mold 12A will therefore first contacts the surface of the IC chip 3, rather than the wire, via the protruding portion 12a. As a result, the inner surface of the upper metallic mold 12A and the wire 4 are kept from contacting each other and the final amount of warp of the wiring substrate 1X decreases.

After the wiring substrate 1X has been interposed between the upper and lower metallic molds 12A and 11, mold resin 5 is injected into the molds from the injection hole 13 formed in the upper metallic mold 12A at a predetermined pressure. Thus, the mold resin 5 is injected into a cavity formed between the inner surface of the upper metallic mold 12A and the wiring substrate 1X, and the wiring substrate 1X is pushed against the lower metallic mold 11 due to a pressure applied to the mold resin 5. As a result, the warp of the wiring substrate 1X is corrected.

Further, as illustrated in FIG. 4C, after the mold resin 5 has been cured, the upper and lower metallic molds 12A and 11 are removed and the wiring substrate 1X of which its surface is sealed by the mold resin 5 is removed. The mold resin 5 after having been removed from the molds has concave portions 5a formed by the protruding portions 12a of the upper metallic mold 12A at positions corresponding to the respective central portions of the IC chips 3. The subsequent process is carried out in the same manner as in the first embodiment.

As described above, in the method for producing a semiconductor device according to the second embodiment, the upper metallic mold 12A has the protruding portions 12a whose heightwise dimension is greater than the distance between the surface of the IC chip 3 mounted on the wiring substrate 1X to the highest position of the wire 4 formed by bonding on the surface of the IC chip 3 and is smaller than the heightwise dimension of the mold resin 5 formed on the IC chip 3. The mold resin 5 is injected into the molds with the wiring substrate 1X interposed between the upper and lower metallic molds 12A and 11. As a result, there is insignificant risk that when the wiring substrate 1X is interposed between the upper and lower metallic molds 12A and 11, that the wire 4 contacts the upper metallic mold 12A, and deformation of the wire 4 is thereby prevented. Accordingly, occurrence of short circuits caused by deformed wires 4 contacting each other is prevented.

Further, it is not necessary that the contact prevention resin 7 adheres to the surface of the IC chip 3. Therefore, the production process is simplified as compared with the first embodiment.

Third Embodiment

Figure 5A:
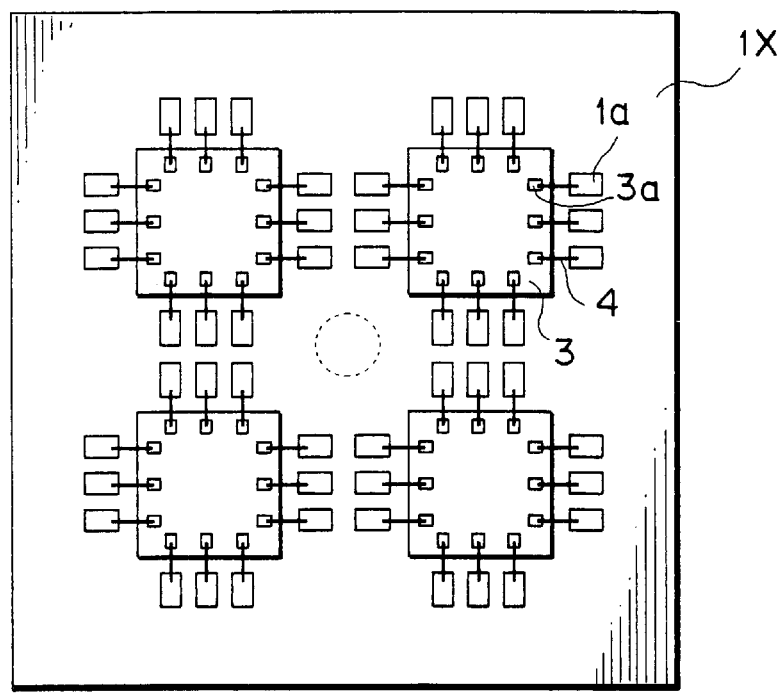
FIGS. 5A, 5B, and 5C are explanatory diagrams showing a method for producing a semiconductor device according to a third preferred embodiment of the present invention.
Figure 5B:
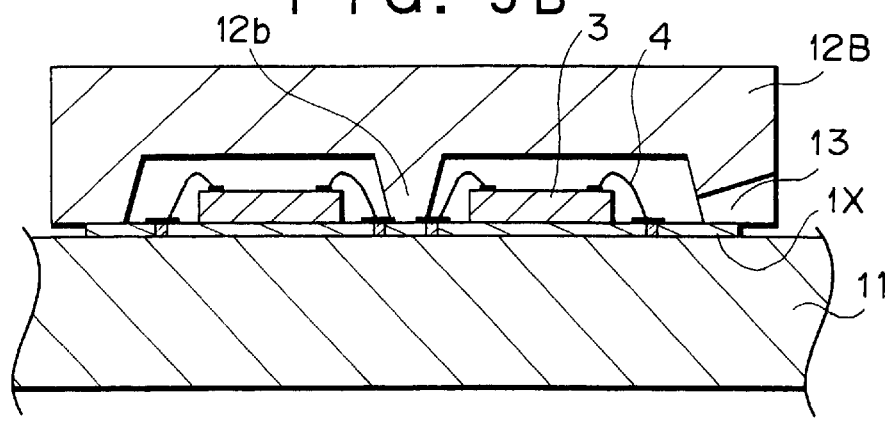
Figure 5C:
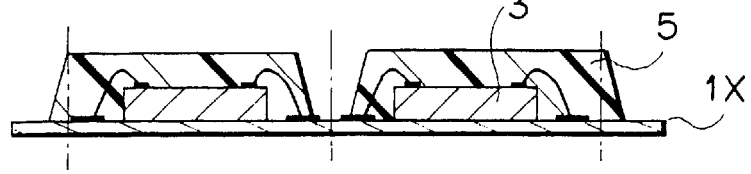

FIGS. 5A to 5C are explanatory diagrams showing a method for producing a semiconductor device according to a third preferred embodiment of the present invention. Note that the same members as those in FIGS. 4A to 4C will be denoted by the same reference numerals.

The production method shown in FIGS. 5A to 5C is different from the production method shown in FIGS. 4A to 4C in the position and dimensions of the contact prevention protruding portion formed at the inner side of the upper metallic mold.

That is, the upper metallic mold 12A shown in FIG. 4B has the contact prevention protruding portions 12a on the inner surface of the upper metallic mold 12A at the positions corresponding to the respective central portions on the surfaces of the IC chips 3 so as to prevent the wire 4 from contacting the inner surface of the upper metallic mold 12A. On the other hand, an upper metallic mold 12B shown in FIG. 5B has a warp prevention protruding portion 12b formed at a position corresponding to a boundary at which, when the wiring substrate for which molding is completed, will be separated into different semiconductor devices. The protruding portion 12b has the same heightwise dimension as that of the internal space formed by the upper metallic mold 12B and the wiring substrate 1X. That is, when the upper metallic mold 12B is put on the wiring substrate 1X, the protruding portion 12b contacts the surface of the wiring substrate 1X and warp of the wiring substrate 1X is thereby suppressed or corrected.

Referring now to FIGS. 5A to 5C, the method for producing a semiconductor device according to the third embodiment will be described hereinafter.

As illustrated in FIG. 5A, first, the wiring substrate 1X is produced in which plural sets of wiring patterns 1a and 1b, and through holes 1c are arranged, corresponding to each of the plural IC chips 3, in transverse and vertical directions in a region around a corresponding IC chip 3. The IC chips 3 are each fixed by the adhesive agent 2 at a predetermined position on the wiring substrate 1X, and the electrode 3a on the surface of each IC chip 3 and the wiring pattern 1a corresponding thereto are connected to each other via the wire 4. The wire 4 is bonded to the electrode 3a and to the wiring pattern 1a.

Next, as shown in FIG. 5B, the wiring substrate 1X on which the IC chips 3 are mounted is placed on the lower metallic mold 11 heated to 170° C. or thereabouts, and the corresponding upper metallic mold 12B is placed thereon. The upper metallic mold 12B has, as described above, the protruding portion 12b for preventing warp of the wiring substrate 1X, formed at the inner side of the mold at a position corresponding to the boundary, which will later be cut to form separate semiconductor devices. As a result, the warp of the wiring substrate 1X is suppressed or corrected and the inner surface of the upper metallic mold 12B and the wire 4 are kept from contacting each other.

After the wiring substrate 1X has been interposed between the upper and lower metallic molds 12B and 11, the mold resin 5 is injected into the molds from the injection hole 13 formed in the upper metallic mold 12B at a predetermined pressure.

Further, as illustrated in FIG. 5C, after the mold resin 5 has been cured, the upper and lower metallic molds 12B and 11 are removed and the wiring substrate 1X of which its surface is sealed by the mold resin 5, is removed. The mold resin 5 thus obtained has a region with no resin formed, at the boundary between semiconductor devices corresponding to the protruding portion 12b of the upper metallic mold 12B. The subsequent process is the same as that of the first embodiment.

As described above, in the method for producing a semiconductor device according to the third embodiment, the upper metallic mold 12B having the protruding portion 12b for correcting the warp of the wiring substrate 1X at the position corresponding to the boundary between semiconductor devices on the wiring substrate 1X is placed on the wiring substrate 1X, and the mold resin 5 is injected into the molds. As a result, there is no significant risk that when the wiring substrate 1X is interposed between the upper and lower metallic molds 11 and 12B, that the wire 4 contacts the upper metallic mold 12B, thereby preventing deformation of the wire 4 and occurrence of short circuits. Further, it is not necessary to adhere the contact prevention resin 7 to the surface of each of the IC chips 3. Therefore, the production process is simplified as compared with that of the first embodiment. Moreover, since the protruding portion 12b is provided at the position corresponding to the boundary between semiconductor devices, substantially no pressure is applied to the IC chips 3 or the like when the wiring substrate 1X is interposed between the upper and lower metallic molds 11 and 12B. Therefore, the improvement in the quality of the resulting product can be expected.

The present invention is not limited to the above-described embodiments and various modifications can be made. Examples of modification include the following cases (a) to (e):

(a) The shape and dimensions of the wiring substrate 1X and the number of semiconductor devices produced all together on the wiring substrate 1X are not limited to the examples illustrated in the above-described embodiments;

(b) The semiconductor device shown in FIGS. 1A and 1B has the soldering ball 6 connected externally, but there are cases in which no soldering ball may be required depending on the method of connection to a printed circuit board;

(c) In the method for producing a semiconductor device shown in FIGS. 3A to 3C, the contact prevention resin 7 is attached to each of the surfaces of all IC chips 3, but the contact prevention resin 7 does not necessarily need to be attached to each of the surfaces of all IC chips 3. It suffices that the contact prevention resin 7 be attached to each of the surfaces of the required IC chips 3 at a proper interval in accordance with warpage of the wiring substrate 1X;

(d) In the production method shown in FIGS. 4A to 4C, the upper metallic mold 12A includes the protruding portions 12a formed at the inner side of the mold at the positions corresponding to all IC chips 3, but the protruding portions 12a does not necessarily need to be provided for all of the IC chips 3. It suffices that the protruding portions 12a may be provided at a proper interval in accordance with warpage of the wiring substrate 1X; and (e) In the upper metallic mold 12B used in the production method shown in FIGS. 5A to 5C, the position of the protruding portion 12b is not limited to the position indicated in FIG. 5B. The protruding portion 12b may be provided at an arbitrary position so long as the warp of the wiring substrate 1X can be corrected without adversely affecting the IC chips 3 and the wire 4.

What is claimed is:

1. A method for producing a semiconductor device, comprising the steps of:

(a) bonding a plurality of semiconductor elements onto a wiring substrate, the wiring substrate having a wiring pattern formed thereon for external connection, and each of the semiconductor elements having a surface with an electrode thereon;

(b) connecting the electrode on the surface of each of the semiconductor elements to the wiring pattern on the wiring substrate with a metal wire;

(c) fixing a contact prevention resin to the surface of at least one of the plurality of semiconductor elements, the contact prevention resin being at a position corresponding substantially to the center of the at least one semiconductor element, and being sized so as not to cover the electrode on, and the metal wire connected to, the at least one semiconductor element;

(d) placing the wiring substrate, with the surface of each of the semiconductor elements facing upward, in a lower metallic mold for mold processing;

(e) putting an upper metallic mold on the wiring substrate placed in the lower metallic mold, the upper metallic mold including a protruding portion which contacts the wire substrate at the periphery thereof for molding processing, to prevent warping of the wiring substrate;

(f) injecting mold resin into a space between the wiring substrate and the upper metallic mold for sealing the semiconductor elements and the metal wires on the wiring substrate; and (g) cutting the wiring substrate sealed by the mold resin into portions corresponding to the plurality of semiconductor elements to thereby form a plurality of semiconductor devices.

2. A method for producing a semiconductor device according to claim 1, wherein the contact prevention resin has a predetermined height that is selected to be higher than a maximum height of metal wire above the surface of any of the semiconductor elements.

3. A method for producing a semiconductor device according to claim 1, wherein the contact prevention resin is fixed to the surfaces of each of the semiconductor elements.

4. A method for producing a semiconductor device, comprising the steps of:

(a) bonding a plurality of semiconductor elements onto a wiring substrate, the wiring substrate having a wiring pattern for external connection formed thereon, and each of the semiconductor elements having a surface with an electrode thereon;

(b) connecting the electrode on the surface of each of the semiconductor elements to the wiring pattern on the wiring substrate with a metal wire;

(c) placing, in a lower metallic mold for mold processing, the wiring substrate with the surfaces of the semiconductor elements facing upward;

(d) placing an upper metallic mold for mold processing on the wiring substrate placed in the lower metallic mold, the upper mold having a contact prevention protruding portion on an internal surface of the upper metallic mold;

(e) injecting mold resin into a space between the wiring substrate and the upper metallic mold sealing the semiconductor elements and the metal wires on the wiring substrate; and (f) cutting the wiring substrate sealed by the mold resin into portions corresponding to the plurality of semiconductor elements to thereby form a plurality of semiconductor devices;

wherein the protruding portion on the internal surface of the upper metallic mold is formed at a position corresponding substantially to the center of at least one of the plurality of semiconductor elements bonded to the wiring substrate, and a dimension of the protruding portion in a direction in which it protrudes is greater than a distance between the surface of the semiconductor element and a highest maximum position of the metal wire, and smaller than a height of the mold resin injected onto the semiconductor element, relative to the surfaces of the semiconductor element.

5. A method for producing a semiconductor device, comprising the steps of:

(a) bonding a plurality of semiconductor elements onto a wiring substrate, the wiring substrate having a wiring pattern for external connection formed thereon, and each of the semiconductor elements having a surface with an electrode thereon;

(b) connecting the electrode on the surface of each of the semiconductor elements to the wiring pattern on the wiring substrate with a metal wire;

(c) placing, in a lower metallic mold for mold processing, the wiring substrate with the surfaces of the semiconductor elements facing upward;

(d) placing an upper metallic mold for mold processing on the wiring substrate placed in the lower metallic mold, the upper mold having a contact prevention protuding portion on an internal surface of the upper metallic mold;

(e) injecting mold resin into a space between the wiring substrate and the upper metallic mold sealing the semiconductor elements and the metal wires on the wiring substrate; and (f) cutting the wiring substrate sealed by the mold resin into portions corresponding to the plurality of semiconductor elements to thereby form a plurality of semiconductor devices;

wherein the protruding portion on the internal surface of the upper metallic mold is formed at a position corresponding substantially to the center of at least one of the plurality of semiconductor elements bonded to the wiring substrate, and a dimension of the protruding portion in a direction in which it protrudes is greater than a distance between the surface of the semiconductor element and a highest maximum position of the metal wire, and smaller than a height of the mold resin injected onto the semiconductor element, relative to the surfaces of the semiconductor element.

6. A method for producing a semiconductor device, comprising the steps of:

(a) bonding a plurality of semiconductor elements onto a wiring substrate, the wiring substrate having a wiring pattern for external connection formed thereon, and each of the semiconductor elements having a surface with an electrode thereon;

(b) connecting the electrode on the surface of each of the semiconductor elements to the wiring pattern on the wiring substrate with a metal wire;

(c) placing, in a lower metallic mold for mold processing, the wiring substrate with the surfaces of the semiconductor elements facing upward;

(d) placing an upper metallic mold for mold processing on the wiring substrate placed in the lower metallic mold, the upper mold having a contact prevention protruding portion on an internal surface of the upper metallic mold;

(e) injecting mold resin into a space between the wiring substrate and the upper metallic mold sealing the semiconductor elements and the metal wires on the wiring substrate; and (f) cutting the wiring substrate sealed by the mold resin into portions corresponding to the plurality of semiconductor elements to thereby form a plurality of semiconductor devices;

wherein the protruding portion on the internal surface of the upper metallic mold is formed at a boundary between the semiconductor elements, and a dimension of the protruding portion in a direction in which it protrudes is equal to a height of a space formed between the wiring substrate and the upper metallic mold.

* * * * *